United States Patent [19]

Hung

[11] Patent Number: 5,368,094
[45] Date of Patent: Nov. 29, 1994

[54] BIPARTITE HEAT SINK POSITIONING DEVICE FOR COMPUTER CHIPS

[76] Inventor: Chin-Ping Hung, No. 42, Wen-Hwa Rd., Chung-Li, Taiwan, Prov. of China

[21] Appl. No.: 144,432

[22] Filed: Nov. 2, 1993

[51] Int. Cl.[5] .................................................. F28F 7/00
[52] U.S. Cl. .................................... 165/80.3; 165/121; 165/185; 257/718; 257/722; 361/695; 361/697
[58] Field of Search ................. 165/80.3, 185, 121; 174/16.3; 257/713, 718, 719, 722; 361/695, 697

[56] References Cited

U.S. PATENT DOCUMENTS 5,251,101 10/1993 Liu .................................. 257/718 X

FOREIGN PATENT DOCUMENTS

| | | | |
|---|---|---|---|
| 3446569 | 7/1986 | Germany | 257/718 |
| 82560 | 3/1990 | Japan | 257/722 |
| 232261 | 10/1991 | Japan | 257/722 |

*Primary Examiner*—John Rivell
*Assistant Examiner*—L. R. Leo
*Attorney, Agent, or Firm*—Bacon & Thomas

[57] ABSTRACT

A bipartite heat sink positioning device for computer chips incorporates a two-piece heat sink including a plurality of fins projecting from upper surfaces thereof and generally flat bottom surfaces adapted to engage a computer chip. Each of the sink bodies include inner and outer end portions with the inner end portions terminating in respective upstanding walls and the outer end portions being formed with respective elastic clamping parts. The outer end portions are also each formed with a pair of spaced fixing holes. The heat sink is adapted to be secured to a computer chip by positioning the first and second sink bodies upon the chip with the elastic clamping pans engaging respective opposing side shoulders of the chip and the inner end portions of the sink bodies being slightly spaced. The bipartite heat sink positioning device further includes a fan including a body provided with four tap holes positioned in spaced intervals about an outer peripheral portion of the body of the fan. The fan is adapted to be mounted upon the heat sink by means of a plurality of fasteners adapted to extend through the tap holes of the fan and to be secured within the fixing holes of the heat sink. According to a first embodiment, securing the fasteners causes the inner end portions of the sink bodies to come together thereby causing the clamping pans to firmly grasp the chip. In a second embodiment, a spring is used to bias the sink bodies together.

4 Claims, 4 Drawing Sheets

BIPARTITE HEAT SINK POSITIONING DEVICE FOR COMPUTER CHIPS

BACKGROUND OF THE INVENTION

1. Field of the Invention

The present invention relates to a bipartite heat sink positioning device for computer chips. The heat sink actually consists of two sink bodies. A fan is adapted to be secured with the heat sink to a computer chip. Each of the sink bodies includes a clamping part extending downwardly from the heat sink at an angle of about 85°. When the fan is secured to the heat sink, the sink bodies are shifted toward each other relative to the computer chip thus causing the clamping part at both ends of the sink to tighten inwardly on the chip.

2. Description of the Prior Art

Currently, the manner in which heat is expelled from a central processing unit (CPU) of a computer is to install a heat sink device directly on the CPU to thereby expel the high temperature generated during the operation. Ordinarily, a heat sink positioning device consists of a fan and a sink device with the heat sink being directly adhered to the CPU such that the heat generated by the CPU is conducted to the heat sink and then the fan is used to expel the high temperature of the heat sink. The structure and positioning methods of such heat sink positioning devices are known from R.O.C. Patents registered by the numbers of 144052, 166357, 186944, 188700, 198531 and 204035. Among which the most popularly applied heat sink positioning devices are of the gluing type and the circlip type. The gluing type is illustrated in FIG. 6 wherein glue K is used to directly adhere the heat sink device AM on top of the CPU; and the circlip type is shown in FIG. 7 wherein a C-type clip ring FM1 is used to lock the shoulders of heat sink FM and the CPU.

The above mentioned known types of heat sink positioning devices suffer from the following defects:

1. Glue is not a good conductor, and will interfere with the heat conducting effect.
2. With the clip hook (or single C-type circlip) type arrangement, the heat sink might easily slide when the holding force is not strong enough.
3. Bolts are used for assembling the heat sink and fan in such known devices with the bolts being fixed between fins (refer to FIG. 7) resulting in a poor fixing arrangement.
4. The prior art heat sink devices are molded in one piece resulting in a larger surface area that can vary in flatness and therefore the bottom of the heat sink might often be concave so as to form point contacts, and seams can exists between the heat sink and the CPU such that the heat generated would not be completely conducted.
5. The known heat sink devices enable the CPU to shift downward or vertically because the injection molding cannot readily compensate for chips which are not exactly square thereby resulting in a slight difference in the length ratio for the sides, so it is easier to hold the chip from one direction but difficult when arranged in another direction.

SUMMARY OF THE INVENTION

The purpose of the present invention is to solve the above-mentioned defects by providing a bipartite heat sink positioning device for computer chips by equally dividing the heat sink into two parts and securing the heat sink to the fan and CPU in an effective manner.

Another purpose of the present invention is to provide a bipartite heat sink positioning device for computer chips, for which the heat sink is divided into two pieces, so the surface processing area is smaller, whereby the difference in flatness is thus reduced and more precise for processing, which will cause the heat sink to closely contact the CPU such that the heat conducting effect can be increased.

One further purpose of the present invention is to provide a bipartite heat sink positioning device for computer chips wherein the assembly of the heat sink and the CPU is performed by securing the two-piece sink bodies on the CPU in such a manner that it will be easy to hold the CPU from each side thereof.

These and other purposes of the present invention are achieved by providing a bipartite heat sink positioning device for computer chips that incorporates a two-piece heat sink bodies having a plurality of fins projecting from upper surfaces thereof and generally flat bottom surfaces adapted to engage a computer chip. Each of the sink bodies includes inner and outer end portions with the inner end portions terminating in respective upstanding walls and the outer end portions being formed with respective elastic clamping pans. The outer end portions are also each formed with a pair of spaced fixing holes. The heat sink is adapted to be secured to a computer chip by positioning the first and second sink bodies upon the chip with the elastic clamping parts engaging respective opposing side shoulders of the chip and the inner end portions of the sink bodies being slightly spaced. The bipartite heat sink positioning device further includes a fan including a body provided with four tap holes positioned in spaced intervals about an outer peripheral portion of the body of the fan The fan is adapted to be mounted upon the heat sink by means of a plurality of fasteners adapted to extend through the tap holes of the fan and to be secured within the fixing holes of the heat sink.

When the fan is initially placed upon the heat sink, the tap holes are slightly out of alignment with the fixing holes. According to one preferred embodiment of the invention, securing the plurality of fasteners within respective tap and fixing holes causes the sink bodies to shift such that their inner end portions are drawn together while simultaneously forcing the clamping pans into clamping engagement with the side shoulders of the chip. In accordance with another embodiment of the invention, a spring is provided to interconnect the sink bodies upon the chip and to bias the sink bodies together such that the tap holes are aligned with the fixing holes. The spring preferably has first and second ends configured as V-shaped hooks that are interconnected by an elongated portion. The elongated portion is adapted to extend between adjacent fins of one of the sink bodies and the V-shaped hooks are adapted to engage opposing end sections of a fin provided on the other sink body in order to draw the sink bodies together.

Additional objects, features and advantages of the present invention will become more readily apparent from the following detailed description of preferred embodiments thereof when taken in conjunction with the following drawings wherein like reference numerals refer to corresponding parts in the several views.

DETAILED DESCRIPTION OF THE PREFERRED EMBODIMENTS

Figure 1:
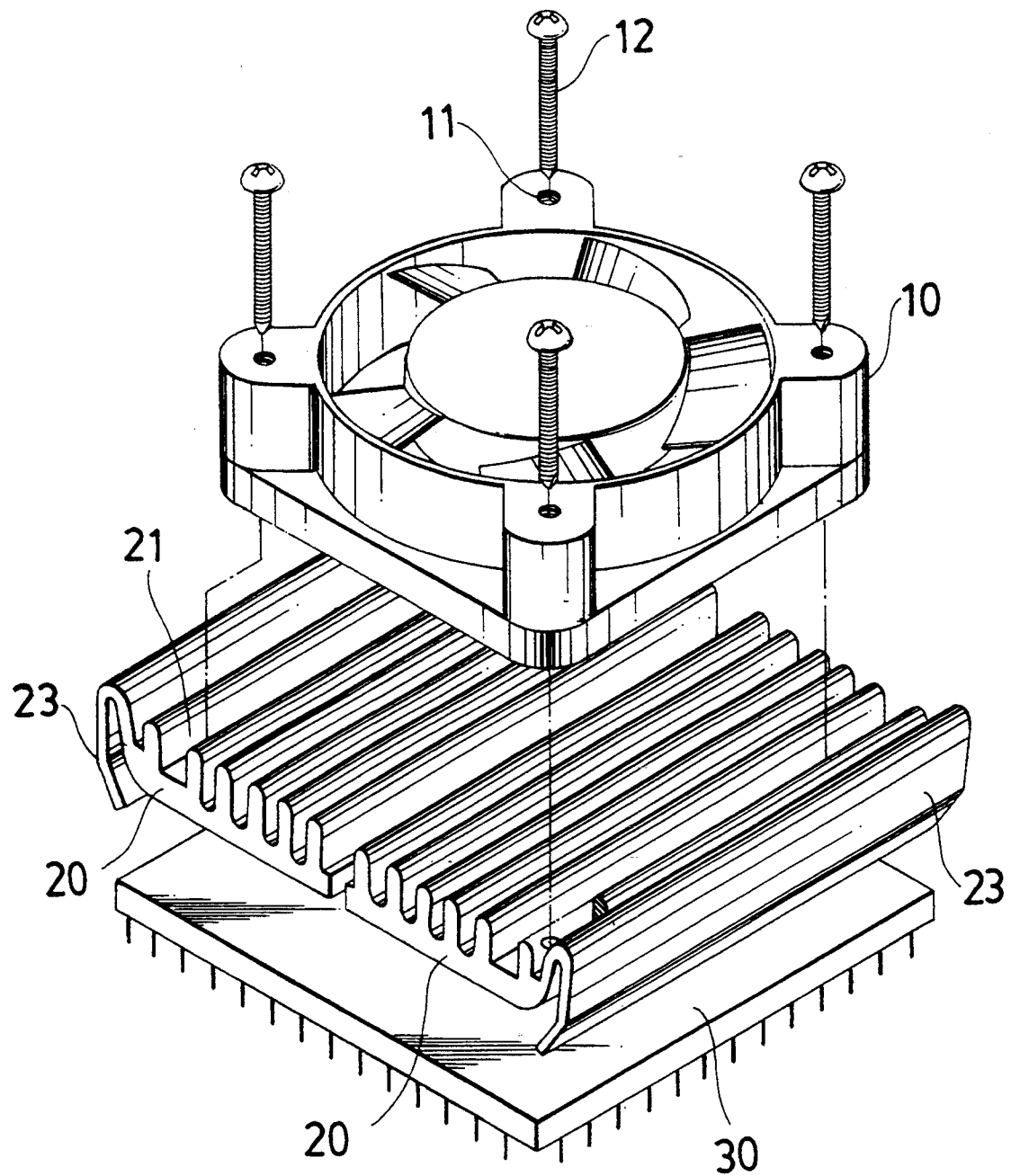
FIG. 1 is an exploded perspective view of the heat sink positioning device of the present invention.

Referring to FIG. 1, the bipartite heat sink positioning device for computer chips according to the present invention mainly consists of a heat sink 20, a heat expelling fan 10 and several bolts 12. The heat sink is a plate molded in accordance with the size of a particular CPU 30, and is composed of two equal sink bodies 20. The upper surface of each sink body 20 is molded with fins and defines a vertical wall on one end and an elastic clamping part 23 at the other end. The corners on both fan 10 and heat sink 20 are provided with fixing holes 11 and tap holes 22 respectively.

Figure 2:
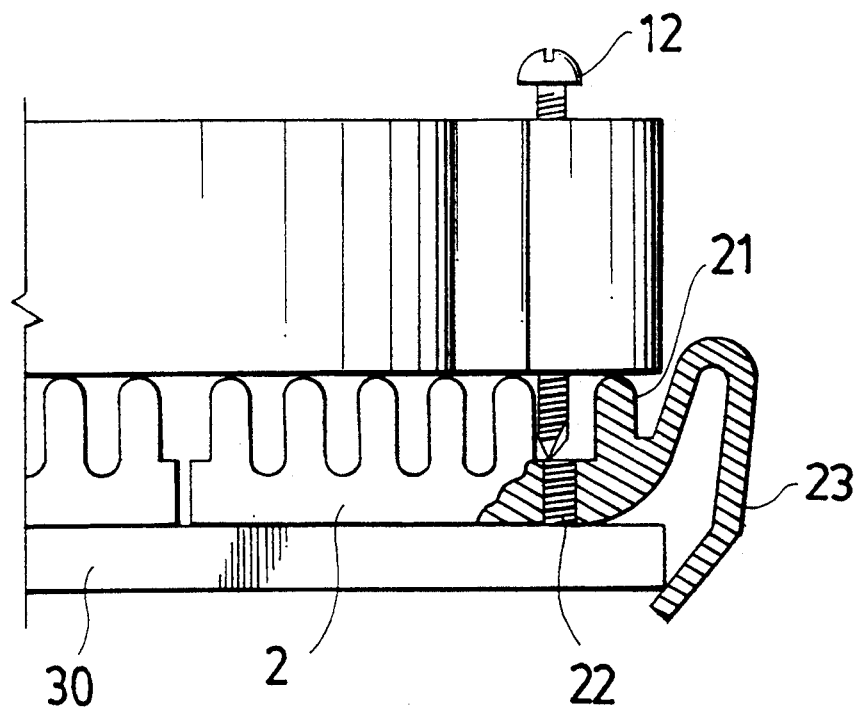
FIG. 2 is an enlarged partial cross-sectional view of the heat sink positioning device shown in FIG. 1 prior to complete assembly.

As clearly shown in FIG. 2, when fan 10 and heat sink 20 are arranged one above the other, the fixing holes 11 and tap holes 22 are not directly aligned, that is the tap holes 22 are deviated from the central lines of fixing holes 11. As also indicated in FIG. 2, tap holes 22 are located between two fins 21. That is, tap holes 22 are formed in a solid seat under that base of fins 21. Clamping part 23 is bent downward with fin 21 extending directly upward to form a longer leverage arm such that an inwardly directed leverage arm angle less then 90° (about 85°) is formed.

Figure 3:
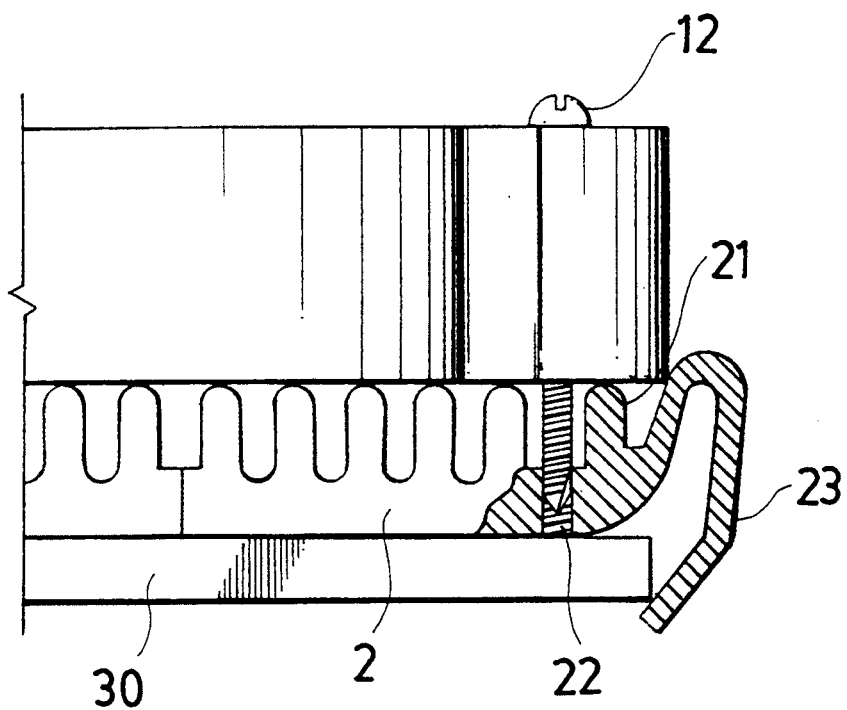
FIG. 3 is an enlarged partial cross-sectional view similar to that shown in FIG. 2, but with the heat sink positioning device in an assembled condition.

The above-described heat sink positioning device is provided to assemble the fan 10 and heat sink 20 into one piece, then the clamping part 23 of heat sink 20 is used to clamp and thereby hold the CPU 30. By this arrangement, the present positioning device can secure fan 10 and heat sink 20 to CPU 30 all at one time. When assembling, the two sink bodies 20 are first positioned on both sides of the top of CPU 30. In order to ensure that clamping part 23 provided at one end of each of the pieces of heat sink 20 will hold the shoulder of CPU 30 as mentioned above, the heat sink 20 is molded in accordance with the size of CPU 30. The assembled surface area of the two sink bodies is a little smaller than that of CPU 30. Therefore a space exists between the two sink bodies 20 (refer to FIG. 2). The fan 10 is then placed on the fins 21 of the sink 20 such that the fixing holes 11 at all corners of fan 10 are generally aligned with the tap holes 22 of sink 20. Bolts 12 are then secured into both fixing holes 11 and tap holes 22. Because of the offset between fixing holes 11 and tap holes 22, when tightening the bolts 12, both of the sink bodies 20 will shift to the center due to the offset between fixing holes 11 and tap holes 22 as indicated in FIG. 3. This shifting will force the external clamping part 23 of heat sink 20 to shift inwardly relative to the shoulder of CPU 30 to tighten clamping part 23 upon CPU 30 with the holding force created by the angle of clamping pan 23 itself and the forces generated by the movement of the heat sink 20 strengthening the holding force. Therefore the heat sink 20 and fan 10 can be firmly fixed on CPU 30 without any worry of relative sliding movement.

As mentioned above, when interconnecting fan 10 and heat sink 20 by bolts 12, the desired positioning effect is achieved simultaneously mainly because the heat sink 20 is divided into two pieces instead of being molded in one piece, and the bolts 12 are inserted directly into the tap holes 22 located at the bottom of heat sink 20. Therefore the force applied to bolts 12 functions to shift heat sink 20 and to increase the clip holding strength due to the longer arm and angle of force assumed by clamping parts 23.

Figure 4:
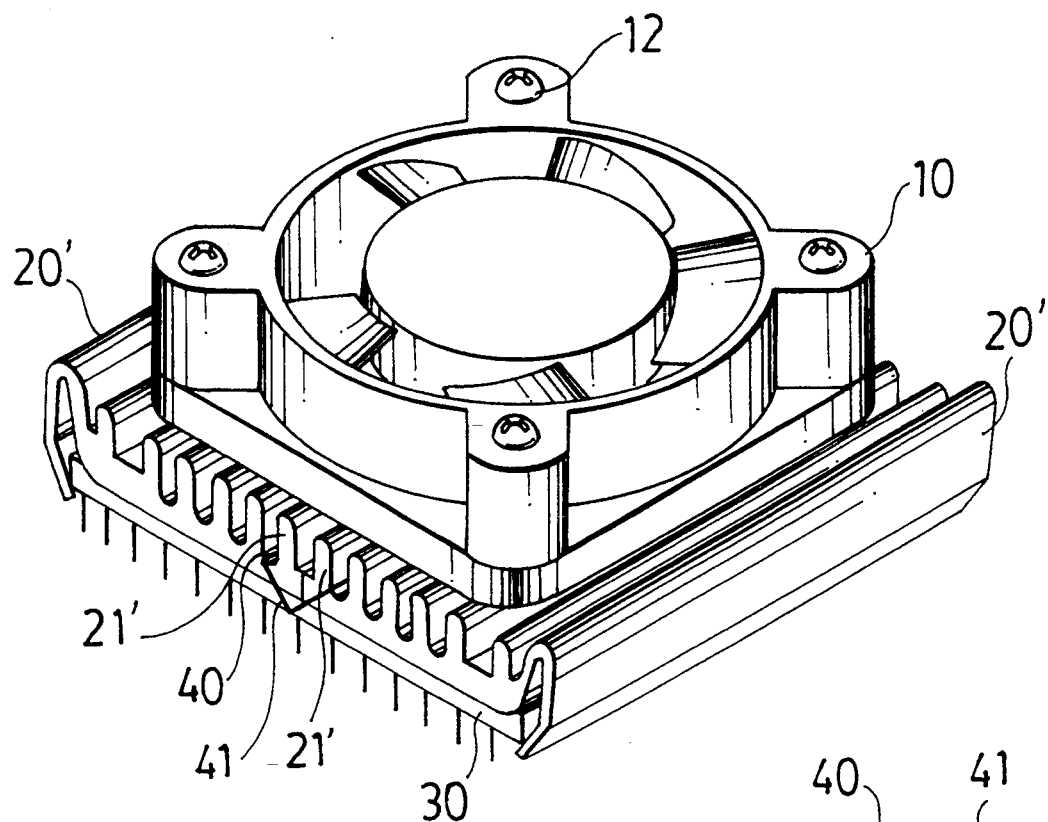
FIG. 4 is a perspective view of a heat sink positioning device according to a second embodiment of the invention in an assembled state.
Figure 5:
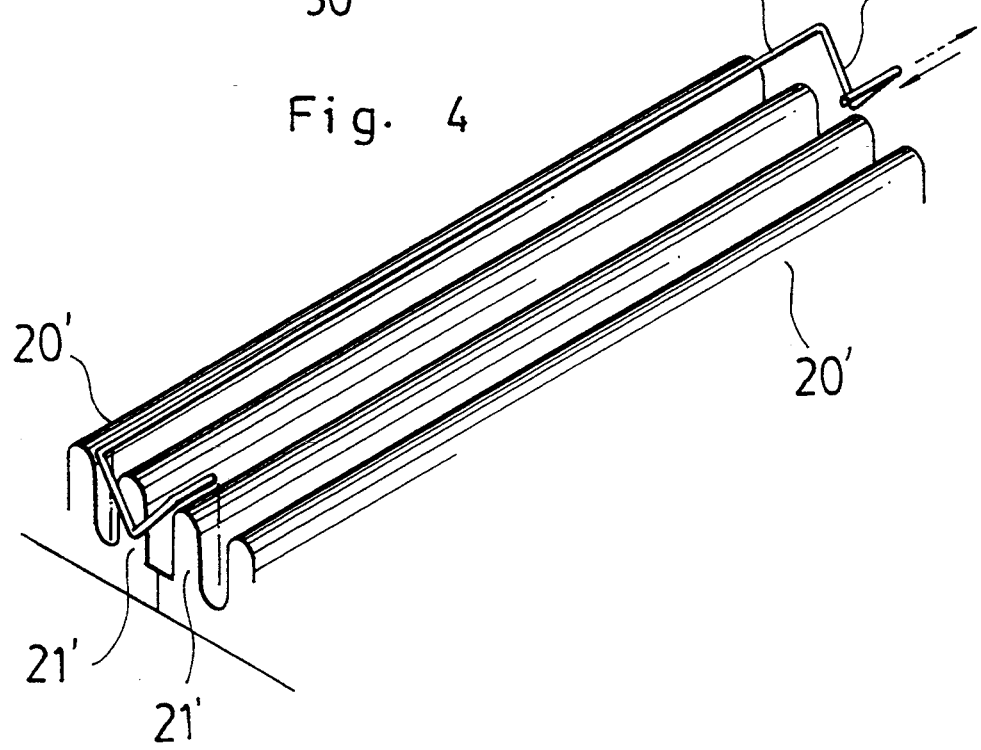
FIG. 5 is a partial, enlarged view of a portion of the heat sink positioning device depicted in FIG. 4.
Figure 6:
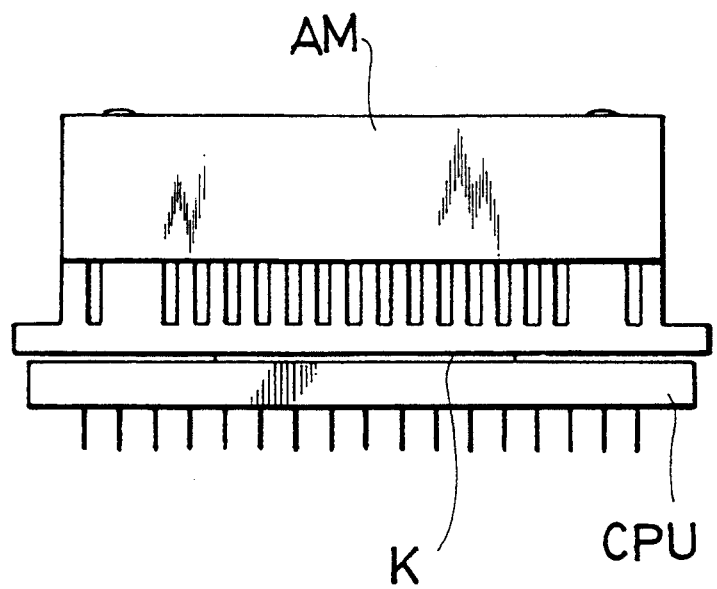
FIG. 6 is a schematic view of a heat sink positioning device known in the art.
Figure 7:
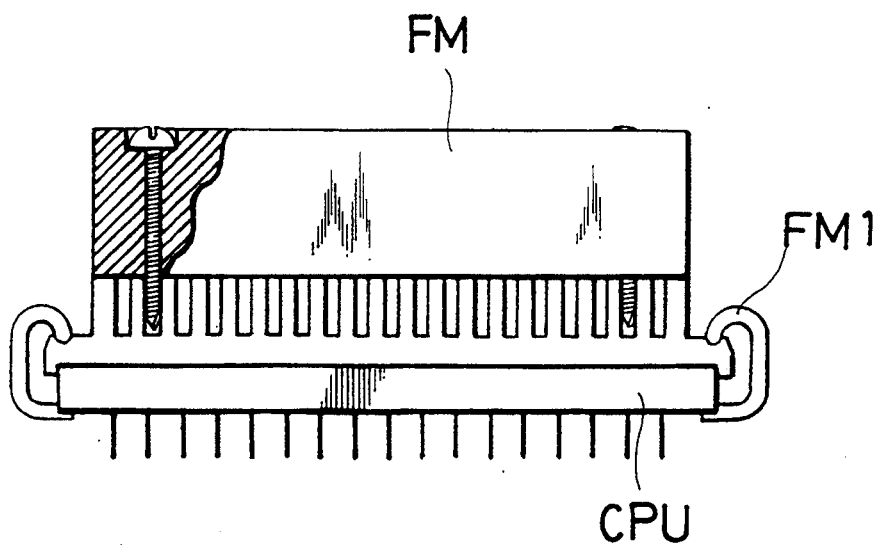
FIG. 7 is a schematic view of another heat sink positioning device known in the art.

In addition to using the offset arrangement between fixing holes 11 and tap holes 22 to firmly fix fan 10 and heat sink 20 in close contact with CPU 30, the present invention can also incorporate a spring 40 having both ends bent to form generally V-shaped hooks 41. As shown in FIGS. 4 and 5, the spring 40 is positioned longitudinally between two fins 21' at one end of one of the sink bodies 20' when assembling, and the ends of the hooks 41 of spring 40 are positioned between two fins 21' of the other sink body 20'. With this arrangement, a holding force is created by spring 40 and its V-shaped hooks 41 to draw and fasten the two sink bodies 20' together. In this position, tap holes 22 on the corners of heat sink 20' will match the fixing holes 11 of fan 10.

It is important to note that because heat sink 20 is divided into two pieces, the surface area for processing is reduced in half, thereby enabling the flatness to be increased such that a more precise fit between heat sink 20 and CPU 30 is created and the heat conducting effect of the heat sink can be improved.

I claim:

1. A bipartite heat sink positioning device for computer chips comprising:

a heat sink including first and second sink bodies formed with a plurality of fins projecting from upper surfaces thereof and generally flat bottom surfaces, each of said sink bodies including inner and outer end portions, the inner end portions of said sink bodies terminating in respective upstanding walls and the outer end portions being formed with respective elastic clamping parts and a pair of spaced fixing holes, said heat sink being adapted to be secured to a computer chip by positioning the first and second sink bodies upon the chip with the elastic clamping parts engaging respective opposing side shoulders of the chip and the inner end portions of said sink bodies being slightly spaced;

a fan including a body provided with four tap holes positioned at spaced intervals about an outer peripheral portion of the body of said fan, said fan being adapted to be mounted upon said heat sink; and a plurality of fasteners adapted to extend through the tap holes of said fan and to be secured within the fixing holes of said heat sink once the tap holes and fixing holes are aligned by shifting of said sink bodies such that the upstanding walls of the inner end portions are drawn together while simultaneously forcing said clamping parts into clamping engagement with the side shoulders of the chip.

2. The bipartite heat sink positioning device according to claim 1, wherein each of said clamping parts is bent downward at an angle less then 90° upon clamping the chip.

3. The bipartite heat sink positioning device according to claim 1, wherein said fixing holes are formed in said sink bodies between respective adjacent ones of said plurality of fins.

4. The bipartite heat sink positioning device according to claim 1, further including a spring adapted to interconnect said sink bodies upon the chip and to bias said sink bodies together such that said tap holes are aligned with said fixing holes, said spring having first and second ends, configured as V-shaped hooks, interconnected by an elongated portion, said elongated portion being adapted to extend between two adjacent fins of said plurality of fins on said first sink body and said V-shaped hooks being adapted to engage opposing end sections of one of the plurality of fins on said second sink body in order to draw said sink bodies together.

* * * * *